July 16, 1968 H. M. MANASEVIT ETAL 3,393,088

EPITAXIAL DEPOSITION OF SILICON ON ALPHA-ALUMINUM

Filed Oct. 2, 1964

*INVENTORS*
HAROLD M. MANASEVIT
WILLIAM I. SIMPSON
J. M. Dubiel
ATTORNEY

United States Patent Office
3,393,088
Patented July 16, 1968

3,393,088
EPITAXIAL DEPOSITION OF SILICON ON ALPHA-ALUMINUM

Harold M. Manasevit, Anaheim, and William I. Simpson, La Puente, Calif., assignors to North American Rockwell Corporation, a corporation of Delaware
Continuation-in-part of application Ser. No. 379,668, July 1, 1964. This application Oct. 2, 1964, Ser. No. 403,439
16 Claims. (Cl. 117—106)

ABSTRACT OF THE DISCLOSURE

A composite comprising a substrate of single crystalline alpha-aluminum oxide and a film of single crystalline silicon chemically bonded to said substrate. A process for producing the composite by epitaxial deposition of silicon from gaseous silane or silicon tetrachloride also is disclosed.

This is a continuation-in-part of application Ser. No. 379,668 filed July 1, 1964, now abandoned. This invention relates to composites of thin crystalline films upon insulating substrates, and more particularly to single crystalline silicon epitaxially grown upon crystalline alpha-aluminum oxide, e.g., sapphire and ruby.

The composites of this invention are useful in the technology of translating devices, e.g., lasers, transistors, rectifiers, resistors, and diodes. Micro-electronic circuits have been produced heretofore from composites of crystalline silicon upon substrates which are semi-conductors, e.g., silicon upon silicon. In the case of a composite of a film of crystalline silicon on a semi-conducting substrate, to form the film into electrically isolated components for a circuit, it is necessary to resort to reverse biasing methods. Circuits of crystalline silicon components which have been electrically isolated from each other and from their substrates through reverse biasing present the disadvantages of creating stray electrical effects which, for example, inhibit the speed of diode switches, of limiting the range of useable frequencies, and of restricting the amount of power that may be impressed upon or dissipated by such circuits.

The characterizing feature of this invention is a composite of crystalline silicon grown upon an electrically insulating substrate of crystalline alpha-aluminum oxide. The silicon film may be divided into circuit components by chemical or mechanical etching through the film down to the substrate. Impregnating the film or the separated areas of the film with acceptor or donor impurities converts the separated areas to transistor or diode type components for miniaturized circuitry containing both active and passive components and required inter-connections. This technique provides complete and positive electrical isolation of the components from each other by virtue of the fact that the substrate is insulating. Such complete electrical isolation of the crystalline silicon components by the insulating substrate as is provided by this invention eliminates undesirable inter-component electrical effects, e.g., capacitative coupling, characteristic of micro-circuits on semi-conductor substrates, and avoids the others of the above mentioned disadvantages of semi-conductor substrates. The electrically insulating substrates of the composites of this invention advantageously serve as heat sinks because of the high thermal conductivity of the substrates, i.e., the crystalline alpha-aluminum oxide has relatively high thermal conductivity at both high and very low temperature ranges. Also, the invention provides for the production of micro-electronics with optimum reliability, cost, size, and weight.

Figure 1:
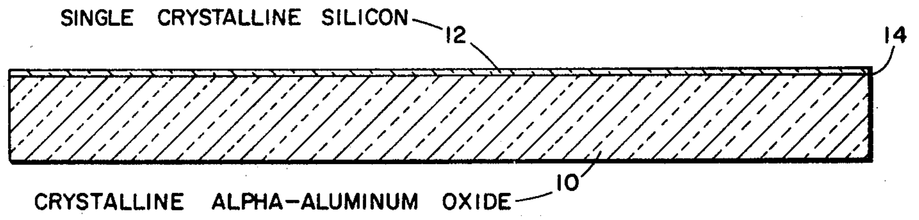
Figure 2:
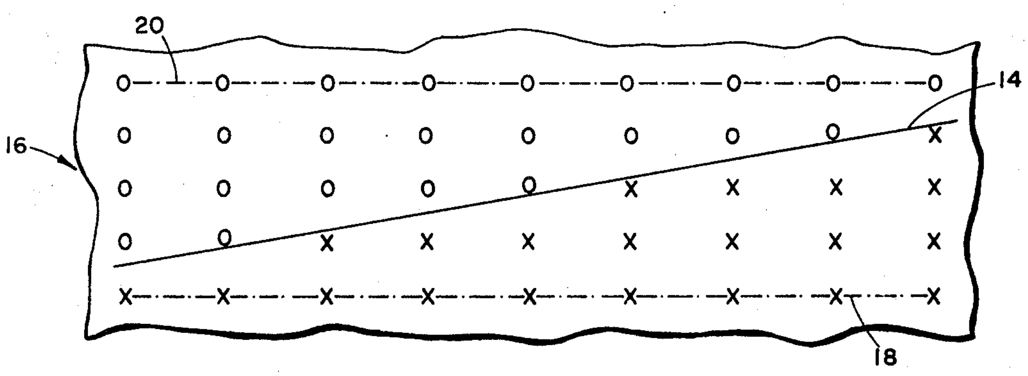

In the accompanying drawing, FIG. 1 is a representation of a composite of this invention shown in section on a greatly enlarged scale; and FIG. 2 is a diagram for a micro-portion of the composite including a schematic representation of the lattice structures of a silicon epitaxial growth upon sapphire.

Referring to FIG. 1, reference numeral 10 designates a substrate of crystalline alpha-aluminum oxide, e.g., a sapphire disc, with a film 12 of single crystalline silicon epitaxially grown upon the substrate such that the film is joined to the substrate by chemical bonds. The surface of the sapphire upon which the film 12 is joined, i.e., at the interface of the disc 10 and film 12, is designated by reference numeral 14.

The substrate crystal 10 should be cut along a plane such that the surface 14 thereof, upon which the silicon is to be deposited, is preferably parallel to a specific crystallographic plane which will induce a specific growth direction of the silicon deposit. For convenience in designating various planes of crystalline alpha-aluminum oxide, a modification of the reference system of notification is used herein which has been adopted by the National Bureau of Standards (hereinafter referred to as NBS) for indexing planes in sapphire as is set forth in NBS Circular 539, volume II, pp. 20–23, issued June 15, 1953. The NBS system for sapphire employs the Miller Indices notation of three numbers for designating a crystallographic plane and the NBS system is based on a hexagonal unit cell with axial ratio of $C/A=2.73$. Crystalline alpha-aluminum oxide is rhombohedral; however, the NBS system, based on a hexagonal unit cell, provides an understandable crystallographic designation for indexing planes of crystalline alpha-aluminum oxide. Another system of notation, the Miller-Bravis, also based on a hexagonal unit cell, employs four numbers for designating a crystallographic plane. The NBS system omits the third number of the four numbered Miller-Bravis notation as being superfluous. It is common in the crystallographic art to use a four place notation for designating a plane based on a hexagonal unit cell, the four place notation using a dot in the place of the superfluous third number of the Miller-Bravis system. Herein, the dot is used in the designations for the planes along which crystalline alpha-aluminum oxide may be cut.

According to this invention, controlled growth of silicon is assured if an angle of not more than about 11 degrees exists between the cut surface 14 and an orienting plane of the group consisting of the planes (10·2), (11·4), (11·0), and (00·1). In crystalline alpha-aluminum oxide the plane (10·2) is equivalent to the planes $(0\bar{1}{\cdot}2)$ and $(\bar{1}1{\cdot}2)$; the plane (11·4) is equivalent to the planes $(1\bar{2}{\cdot}4)$, $(\bar{2}1{\cdot}4)$, $(\bar{1}\bar{1}{\cdot}4)$, $(\bar{1}2{\cdot}4)$, and $(2\bar{1}{\cdot}4)$; and the plane (11·0) is equivalent to the planes $(1\bar{2}{\cdot}0)$ and $(\bar{2}1{\cdot}0)$.

For herein designating various planes of a silicon crystal, the NBS system of notation employing the Miller Indices system applied to a diamond-cubic structure, and as is set forth on pp. 6–9 of the aforementioned NBS publication, is used.

Referring to FIG. 2, the illustrated micro-portion of the composite of FIG. 1 is designated generally by numeral 16. The lattice structure of the sapphire substrate 10 is represented as a criss-cross pattern of X's, each of which designates an oxygen atom of sapphire. Dot-dash line 18 represents the (10·2) plane of sapphire as a reference or orienting plane. Full line 14 represents the plane along which the sapphire substrate was cut for reception of the silicon film 12. In FIG. 2, the plane represented by line 14 extends at an angle of about 10° with respect to the (10·2) orientation plane 18 of the sapphire. The lattice structure of the crystalline silicon film 12 is represented as a criss-cross pattern of 0's, each of which designates a silicon atom. Dot-dash line 20 represents the (100) plane of the silicon crystal. The FIG. 2 representation shows that though cut surface 14 of the sapphire extends at a significant angle with respect to an orienting plane of the sapphire, the silicon crystal has grown in such a way that its (100) plane is parallel to the (10·2) plane of sapphire.

Silicon deposits of the composites of this invention have been obtained by high temperature hydrogen reduction of silicon tetrachloride and by thermal decomposition of silane. Such chemicals as trichlorosilane, silicon tetrabromide, and silicon tetraiodide may be used as silicon sources in which the film is deposited by reaction deposition. In addition, high vacuum techniques may be employed in which silicon is evaporated onto a heated sapphire substrate.

Uniform crystallographic results are obtained on substrates that are scratch free, extremely flat, and display a clean surface, free from dust. The substrates of this invention may contain doping elements, e.g., chromium, in the case of ruby, and naturally occurring impurities in the case of alpha corundum, in such amounts that the crystal habit is not affected. Surface cleaning procedures, e.g., one comprising successive treatments with trichloroethylene, synthetic detergent solutions, distilled water, hydrochloric acid etching, and methyl alcohol rinse, have been found advantageous in preparing the substrate for single crystalline silicon growth.

Confirmation of single crystallinity of the films of the composites of this invention has been established through X-ray analysis using both the Laue back reflection technique and the full circle goniometer. The films do not separate from their substrates when the composites are flexed. Also, it has been found that when a film of this invention is dissolved from its substrate by treatment with a hydrofluoric-nitric acid solution, the surface of the substrate from which the silicon film was removed is no longer suitable for deposition of crystalline silicon, but must first be polished and cleaned; whereas exposing a polished surface of substrate to hydrofluoric-nitric acid solution has no effect with respect to the growing of single crystalline silicon.

The term "single crystalline," as is used herein for referring to the silicon films of the composites of this invention, is a generic term comprehending imperfections or faults normally associated with crystals such as, for example, twins, stacking faults, and other dislocations.

The invention is hereinafter illustrated in greater detail by description in connection with the following specific examples:

EXAMPLE I

A synthetic sapphire disc of 1" diameter and 40 mils thick, and having one flat face thereof parallel to the plane (10·2) of sapphire, was optically polished at said flat face to a scratch free finish and cleaned with successive washing treatments to constitute the substrate of the composite to be formed. For deposition of a silicon film upon the disc, the disc was placed upon a silicon pedestal in a reaction chamber, the pedestal being adapted to be heated by a radio-frequency heater. A spacer of pure aluminum oxide was positioned between the pedestal and the disc. The spacer served to provide for uniform heating of the substrate and to prevent direct pickup of silicon from the pedestal by the under side of the substrate. The sapphire substrate was heated to a temperature of about 1250° C. (observed pedestal temperature). For a preliminary hydrogen etch, hydrogen gas was passed through a deoxidizer, molecular sieves, and liquid nitrogen traps and thence through the reaction chamber at a rate of about 3 liters per minute for a period of about 10 minutes, whereupon the temperature of the sapphire was reduced to about 1100° C. A portion of the hydrogen gas (about 800 cc.) was diverted at a place upstream of the reaction chamber and bubbled through liquid silicon tetrachloride maintained at −45° C. The stream of hydrogen and silicon tetrachloride was combined with the main stream of the hydrogen gas and passed into the reaction chamber. Flow of the mixture of hydrogen and silicon tetrachloride through the chamber was effected for a period of about 25 minutes. It was thereupon observed that a uniform film of about 10 microns thick covered the exposed surfaces of the disc. The film was examined by the Laue back reflection technique, and the Laue pattern revealed one set of spots chracteristic of single crystalline silicon superimposed upon another set of spots characteristic of sapphire. Using conventional semi-conductor technology, the silicon film of the composite was converted to diode structures electrically isolated from each other.

EXAMPLE II

The procedure of Example I was repeated except that a ruby of 1/4" diameter was employed in the place of sapphire. A film of crystalline silicon was observed as having been grown on the ruby.

EXAMPLE III

The procedure of Example I was repeated except that silane was used in the place of silicon tetrachloride. A cylinder of silane, at 100 p.s.i., was connected to the hydrogen flow line, and the silane cylinder was opened to permit flow of silane into the hydrogen for mixture with the hydrogen at a rate of about 100 cc. per minute, the hydrogen being fed to the reaction chamber at a flow rate of about 6 liters per minute. Exposure of the sapphire disc to the silane and hydrogen mixture was carried out for a period of about three minutes with the result that a film of about 9 microns thick was observed to have been grown upon the sapphire disc. X-ray examination of the film revealed single crystalline patterns of silicon superimposed upon sapphire.

EXAMPLES IV–XV

The following table lists further examples of composites of this invention formed according to the procedure of Example I; and the table sets forth data showing the relationship of the orientation of the lattice structures of the grown crystalline silicon films with reference to the lattice structures of their respective sapphire substrates.

| Example | Plane of Cut for the Sapphire Substrate | Orientation of the Silicon Film With Respect to the Sapphire |
|---|---|---|
| IV | Parallel to (10·2) | (100) of silicon was parallel to (10·2) of sapphire. |
| V | 11° from (10·2) | (100) of silicon was 1° from (10·2) of sapphire. |
| VI | 4° from (10·2) | (100) of silicon was within 1° from (10·2) of sapphire. |
| VII | 7° from (11·3), 14° from (11·4). | (111) of silicon was 1° from (11·4) of sapphire. |
| VIII | 4° from (11·3), 9° from (11·4). | (111) of silicon was 2° from (11·4) of sapphire. |
| IX | 8° from (11·3), 13° from (11·4). | (111) of silicon was parallel to (11·4) of sapphire. |
| X | 2° from (11·3), 8° from (11·4). | (111) of silicon was 1° from (11·4) of sapphire. |
| XI | 10° from (11·3), 18° from (11·4). | (111) of silicon was 1° from (11·4) of sapphire. |
| XII | 1° from (11·3), 7° from (11·4). | (111) of silicon was 1° from (11·4) of sapphire. |
| XIII | Parallel to (11·0) | (111) of silicon was parallel to the (11·0) of sapphire. |
| XIV | Parallel to (00·1), the basal plane of sapphire. | (111) of silicon was parallel to (00·1) of sapphire. |
| XV | 1° from (00·1) | (111) of silicon was within 1° from (00·1) of sapphire. |

For all of the above examples the tolerances in determining orientation of planes ranged up to plus or minus about 1/2°.

It is seen from the above table that in those cases where the sapphire had been cut with its face 14 extending in a plane which lies from 0° to 11° of parallelism with respect to the (10·2) plane of sapphire, the crystalline silicon grows with the orientation of its crystalline lattice being such that the (100) plane of silicon is within 1° of parallelism with respect to the (10·2) plane of sapphire; in those cases where the sapphire had been cut with its face 14 extending in a plane which lies up to 18° of parallelism with respect to the (11·4) plane of sapphire, the crystalline silicon grows with the orientation of its crystalline lattice being such that the (111) plane of silicon is within 2° of parallelism with respect to the (11·4) plane of sapphire; in those cases where the sapphire had been cut with its face 14 extending in a plane which is parallel to the (11·0) plane of sapphire, the crystalline silicon grows with the orientation of its crystalline lattice being such that the (111) of silicon is parallel to the (11·0) plane of sapphire; and in those cases where the sapphire had been cut with its face 14 extending in a plane which is parallel to the (00·1) plane of sapphire, the crystalline silicon grows with the orientation of its crystalline lattice being such that the (111) plane of silicon is parallel to the (00·1) plane of sapphire. Should the sapphire substrates be cut with their faces 14 extending in planes of variance or divergence from their above mentioned respective reference planes signficantly beyond the upper limits of the relative degrees indicated, then the films are not single crystalline substantially throughout the substrate surface, whereas they are single crystalline over relatively large areas of the substrate when the cuts are made in the ranges of the planes indicated.

It will be understood that it is intended to cover all changes and modifications of the examples of the invention herein chosen for purposes of the disclosure, which do not constitute departures from the spirit and scope of the invention.

Having described the invention, what is claimed is:

1. A composite comprising a substrate of single crystalline alpha-aluminum oxide and a film of single crystalline silicon chemically bonded to said substrate.

2. A composite according to claim 1 in which said substrate is ruby.

3. A composite according to claim 1 in which said substrate is alpha-corundum.

4. A composite according to claim 1 in which said substrate is sapphire.

5. A composite according to claim 1 in which the surface of the said oxide to which said film is bonded extends in the range of from 0° to 11° of parallelism with respect to any plane equivalent to the (10·2) plane of said oxide, and the orientation of the crystalline lattice of said film is such that its (100) plane is within 1° of parallelism with respect to the said plane of said oxide.

6. A composite according to claim 1 in which the surface of the said oxide to which said film is bonded extends in the range of up to 18° of parallelism with respect to any plane equivalent to the (11·1) plane of said oxide and the orientation of the crystalline lattice of said film is such that its (111) plane is within 2° of parallelism with respect to the said plane of said oxide.

7. A composite according to claim 1 in which the surface of the said oxide to which said film is bonded extends in a plane equivalent to the (11·0) plane of said oxide and the orientation of the crystalline lattice of said film is such that its (111) plane is parallel to the said plane of said oxide.

8. A composite according to claim 1 in which the surface of said oxide to which said film is bonded extends in a plane within 1° of parallelism with respect to the (00·1) plane of said oxide and the orientation of the crystalline lattice of said film is such that its (111) plane is within 1° of parallelism with respect to said (00·1) plane.

9. A composite comprising a substrate of sapphire and a film of single crystalline silicon chemically bonded to said substrate, when the surface of the sapphire to which said film is bonded extends in the range of from 0° to 11° of parallelism with respect to any plane equivalent to the (10·2) plane of sapphire, the orientation of the crystalline lattice of said film is such that its (100) plane is within 1° of parallelism with respect to the said plane of sapphire; when the surface of the sapphire to which said film is bonded extends in the range of up to 18° of parallelism with respect to any plane equivalent to the (11·4) plane of sapphire, the orientation of the crystalline lattice of said film is such that its plane is within 2° of parallelism with respect to the said plane equivalent to the (11·4) plane of sapphire; when the surface of the sapphire to which said film is bonded extends in a plane equivalent to the (11·0) plane of sapphire, the orientation of the crystalline lattice of said film is such that its (111) plane is parallel to the said plane equivalent to the (11·0) plane of sapphire; and when the surface of the sapphire to which said film is bonded extends within 1° of parallelism with respect to the (00·1) plane of sapphire, the orientation of the crystalline lattice of said film is such that its (111) plane is within 1° of parallelism with respect to the (00·1) plane of sapphire.

10. A process for epitaxially growing single crystalline silicon upon a substrate of single crystalline alpha-aluminum oxide, the process comprising the steps of cutting said substrate along a plane of the group consisting of (a) $(10\cdot2)$, $(0\bar{1}\cdot2)$, $(\bar{1}1\cdot2)$
(b) $(11\cdot4)$, $(1\bar{2}\cdot4)$, $(\bar{2}1\cdot4)$, $(\bar{1}\bar{1}\cdot4)$, $(\bar{1}2\cdot4)$, $(2\bar{1}\cdot4)$
(c) $(11\cdot0)$, $(1\bar{2}\cdot0)$, $(\bar{2}1\cdot0)$
(d) $(00\cdot1)$
(e) the planes which are within 11° of parallelism with respect to any of the planes of subgroup (a) hereinabove,
(f) the planes which are within 18° of parallelism with respect to any of the planes of subgroup (b) hereinabove,
(g) the planes which are within 1° of parallelism with respect to the (00·1) plane of subgroup (d) hereinabove;

exposing the cut substrate to a silicon-containing depositing medium for deposition of silicon upon the cut substrate, whereby single crystalline silicon will epitaxially grow upon the cut surface of said substrate.

11. The process of claim 10 in which said substrate is ruby.

12. The process of claim 10 in which said substrate is alpha-corundum.

13. The process of claim 10 in which said substrate is sapphire.

14. The process of claim 10 in which said depositing medium consists essentially of hydrogen and silicon tetrachloride.

15. The process of claim 10 in which said depositing medium consists essentially of hydrogen and silane.

16. The process of claim 10 in which said depositing medium contains $SiH_4$.

References Cited

UNITED STATES PATENTS

| | | | |
|---|---|---|---|
| 3,155,621 | 11/1964 | Cowlard et al. | 252—62.3 |
| 3,173,814 | 3/1965 | Law | 148—1.5 X |
| 3,177,100 | 4/1965 | Mayer et al. | 117—106 X |

ALFRED LEAVITT, *Primary Examiner.*

C. K. WEIFFENBACH, *Assistant Examiner.*

PO-1050
(5/69)

UNITED STATES PATENT OFFICE
CERTIFICATE OF CORRECTION

Patent No. 3,393,088 Dated July 16, 1968

Inventor(s) Harold M. Manasevit and William I. Simpson

It is certified that error appears in the above-identified patent and that said Letters Patent are hereby corrected as shown below:

The title, which reads "Epitaxial Deposition of Silicon on Alpha-Aluminum" should read --Epitaxial Deposition of Silicon on Alpha-Aluminum Oxide--.

SIGNED AND SEALED
FEB 9 1971

(SEAL)
Attest:

Edward M. Fletcher, Jr.
Attesting Officer

WILLIAM E. SCHUYLER, JR.
Commissioner of Patents